June 9, 1964 W. M. KAUFMAN 3,136,897

MONOLITHIC SEMICONDUCTOR STRUCTURE COMPRISING AT LEAST ONE JUNCTION TRANSISTOR AND ASSOCIATED DIODES TO FORM LOGIC ELEMENT

Filed Sept. 25, 1961 2 Sheets-Sheet 1

WITNESSES

John E. Healy, Jr.

Gordon H. Telfer

INVENTOR

William M. Kaufman

BY

Frederick Shapoe

ATTORNEY

MONOLITHIC SEMICONDUCTOR STRUCTURE COMPRISING AT LEAST ONE JUNCTION TRANSISTOR AND ASSOCIATED DIODES TO FORM LOGIC ELEMENT

Filed Sept. 25, 1961 2 Sheets-Sheet 2

United States Patent Office 3,136,897
Patented June 9, 1964

3,136,897

MONOLITHIC SEMICONDUCTOR STRUCTURE COMPRISING AT LEAST ONE JUNCTION TRANSISTOR AND ASSOCIATED DIODES TO FORM LOGIC ELEMENT

William M. Kaufman, Monroeville, Pa., assignor to Westinghouse Electric Corporation, East Pittsburgh, Pa., a corporation of Pennsylvania Filed Sept. 25, 1961, Ser. No. 140,473
4 Claims. (Cl. 307—88.5)

This invention relates generally to monolithic semiconductor devices which provide within a unitary body of semiconductive material the electronic function of a plurality of conventionally interconnected components such as transistors and diodes. More particularly, this invention relates to monolithic semiconductor devices which perform logic functions.

Present day digital computing and control systems are very bulky and expensive because of the large number of components needed to create even the simpler logic systems. Therefore, considerable recent effort has been applied to miniaturizing present circuitry into a small volume with the hope that facility in manufacturing can be developed to keep costs down. However, such systems still employ individually interconnected components making the attainment of high reliability difficult. For the solution of the latter problem, it is apparent that it would be desirable to avoid the necessity of having separately connected components. To fabricate all of the active elements of a logic system in a single body of semiconductive material, thus avoiding the need for interconnections, presents problems in device design because of the necessity for effective isolation between certain regions of the monolithic device and simplicity in geometry for easier fabrication. One such logic element which it would be desirable to fabricate in a dense array is the so-called "stroke" element which is a universal logic element in that all the logic functions of a digital computer may be performed by combinations of it.

It is therefore an object of the present invention to provide a monolithic semiconductor device which performs the function of a logic element within a unitary body of semiconductive material.

Another object of the invention is to provide stroke elements which may be readily fabricated into a multielementary array of logic elements.

According to the present invention, the conventional stroke element circuit is modified by the transfer of the plurality of parallelly connected diodes conventionally disposed at the input to placement of such diodes at the output of the circuit in order to permit a convenient arrangement of impurity doped regions in the monolithic device. A structure is provided comprising two four-region semiconductor structures of alternating impurity type having one region in common and at least one of the uncommon outer regions divided to form a plurality of p-n junctions with the next adjacent region for use as the output diodes. The first four-region structure is utilized as a diode and a transistor whose collector is part of the diode. Here, too, the outer uncommon region of the four-region structure may be divided to form a plurality of input diodes. The second four-region structure is utilized for the output diodes, as aforesaid, and as a second transistor whose base is coupled to the collector of the first transistor by conductive means incorporated within the block, the first transistor having a floating base to provide electrical isolation between regions of the monolithic device.

Features of the present invention which are believed to be novel are set forth with particularity in the appended claims. The present invention, both as to its organization and fabrication, together with the above mentioned and further objects and advantages thereof, may best be understood by reference to the following description, taken in connection with the accompanying drawings, in which:

Figure 1:
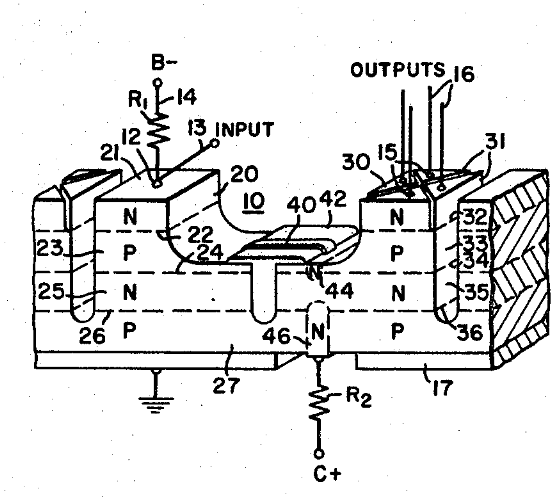
FIGURE 1 is a partial perspective view of a dense array of logic elements incorporating the principles of the present invention.
Figures 2, 3:
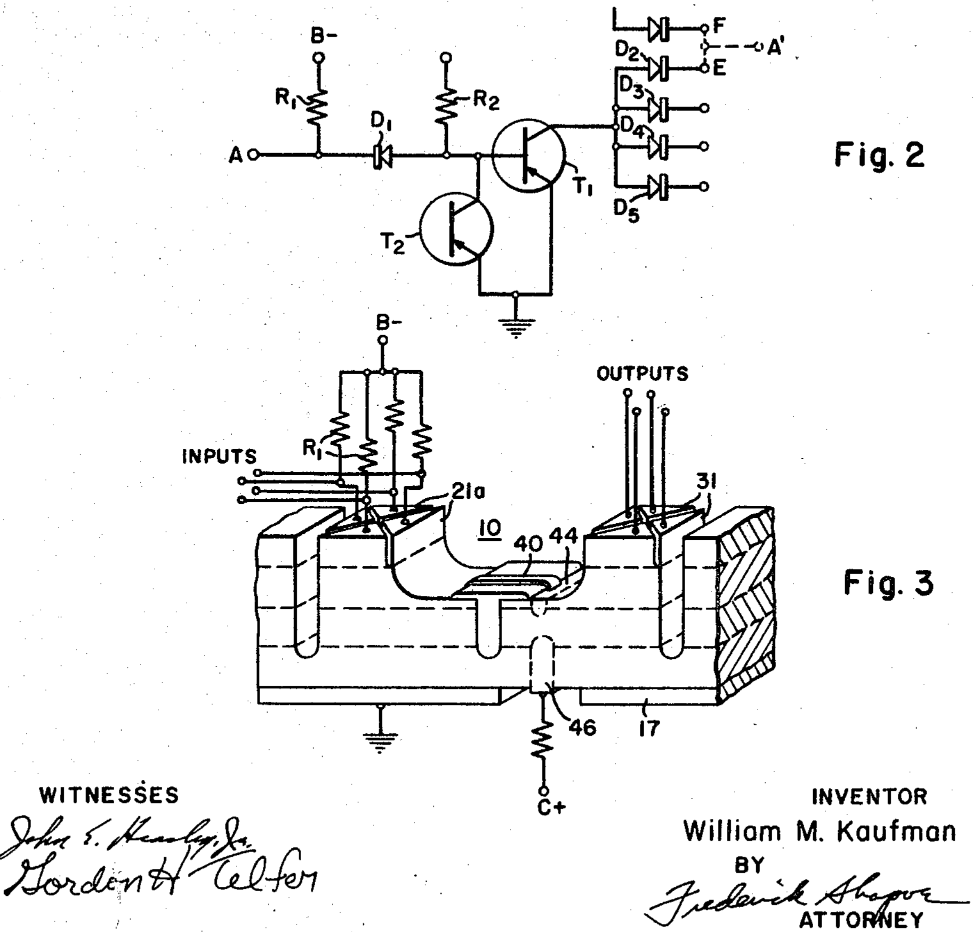
FIG. 2 is the approximate circuit equivalent of the device of FIG. 1.
FIG. 3 is a partial perspective view showing a modification of the device of FIG. 1.

Referring to FIG. 1, there is shown a monolithic structure in accordance with the present invention. The device comprises a plurality of four-layer semiconductor structures of alternate type semiconductivity having a common layer. Merely as an example, the structure is shown as being of the n-p-n-p type. An individual logic element 10 comprises two such four layer structures 20 and 30. For purposes of explanation, external elements are shown for a complete circuit. The circuit of FIG. 2 is the approximate circuit analog of the device of FIG. 1. The structure of FIG. 1 will be more easily understood when reference is made to FIG. 2.

In the first four layer structure 20, on the left-hand side of the drawing, the first layer 21 has an ohmic contact 12 thereon and a lead 13 for the input terminal A by which all inputs are applied to the element. While only one input lead is shown, it is to be understood that a plurality of inputs may be applied to the element. Also on the first layer is provided a lead 14 coupled through a resistor $R_1$ to a point for the application of a bias potential. The first p-n junction 22 between the first and second layers 21 and 23 of the left-hand structure 20 corresponds to the diode $D_1$ of the circuit. The second, third and fourth layers 23, 25 and 27 of the left-hand structure which form p-n junctions 24 and 26, correspond to the transistor $T_2$, the purpose of which will be more fully discussed hereinafter.

In the right-hand structure 30, the second, third and fourth layers 33, 35 and 27, which form the p-n junctions 34 and 36, correspond to the transistor $T_1$. The divided first layer 31 of the right-hand structure which forms the junctions 32 with the second layer 33, corresponds to the multiple diode output $D_2$, $D_3$, $D_4$ and $D_5$ and has ohmic contacts 15 thereon with leads 16 for that purpose. The fourth layer of the structure 27, common to all elements, has a conductive surface 17 thereon which is grounded.

For the connection between the diode $D_1$ and transistor $T_1$, it is necessary to provide a conductive path 40 from the second layer 23 of the left-hand structure 20 to the third layer 35 of the right-hand structure 30. The conductor 40 may be deposited over an insulating material 42 which will prevent undesirable shorting out. An n-type region 44 extends through the junction 34 between the second and third layers 33 and 35 of the right-hand structure to make the contact to the third layer. An n-type region 46 is also provided within the fourth layer 27 for application of an ohmic contact to the third layer 35 which is coupled through a resistor $R_2$ to a second point for the application of bias potential. Alternatively, the resistor $R_2$ may be coupled directly to the conductor 40 on the upper surface of the device.

As indicated in FIG. 1, structural interconnection between elements is provided by the common layer 27 on the bottom surface. The common layer 27 is the emitter of each of the transistors $T_1$ and $T_2$ while the second and third layers 23 and 33 and 25 and 35 are the collectors and bases, respectively.

There is substantially no electrical interconnection through the common layer 27 because in each element, the transistor $T_2$ on the left-hand side with its floating base provides isolation between the diode $D_1$ (junction 22) and ground. Isolation is obtained because there is no base drive for the transistor $T_2$ and thus it remains non-conducting.

In a dense array of elements, electrical interconnection may be made by filling the grooves and valleys between the upper surfaces of the first layer 21 and 31 of each structure with a suitable insulating material (not shown) so that connections between elements may be provided across an even surface. That is leads from the output of one element could be applied across the insulating surface to the input of another element. For convenience in so doing the structures may be staggered in rows so that the outputs of one row of elements are adjacent the input of the next row. To effectively accomplish this, it will be necessary to provide uniform spacing between the input and output of an element and between the output and input of the next element in the row.

The circuit of FIG. 2 is substantially like a conventional stroke element circuit with two important exceptions. The conventional circuit does not include the transistor $T_2$. Also, the conventional circuit provides at the input, rather than at the output as shown in FIG. 2, a plurality of diodes in parallel. In the conventional stroke circuit there is an output under all conditions except when all inputs are on simultaneously. The circuit of FIG. 2 provides the same logic function. Terminal A is a node where a plurality of leads from the output diodes of similar elements are connected. If the output transistor of any one of the so connected elements is in its highly conductive state, then the potential of terminal A is brought near to ground leaving transistor $T_1$ in its blocking state. Transistor $T_1$ in its blocking state may be considered as a binary "one" output signal. If all of the output transistors of the elements connected to terminal A are in their blocking state, then the potential of terminal A approaches B— and sufficient base drive is provided to transistor $T_1$ to cause it to become highly conductive, which may be considered as a binary "zero" state.

The plurality of diodes $D_2$ etc. have been moved to the output side for the purpose of providing a simpler structure. It will be noted that as located here they may be readily formed by a junction 32 with the collector region 33 of the transistor structure $T_1$. If they were to be formed at the input side, for the proper polarity to result, some means would have to be provided so that the base region of the transistor $T_2$ and the input side of the diodes are of the same semiconductivity type. This fabrication problem is avoided by the simple modification shown here.

Since transistor $T_2$ is used merely for isolation, it does not affect the electronic operation of the device. FIG. 3 shows a modification of the device of FIG. 1 which permits even greater flexibility from a single element. The first layer of the left-hand structure, which serves as the input to the element, is divided into a group of separate regions 21*a* as is done for the output resulting in the formation of an element which performs all of the functions of AND, OR and NOT circuits. A resistor $R_1$ is provided in series with each of the input diodes, the other terminal of each of these resistors being connected to the power supply. The application of two or more leads to each of the separate portions of the upper layer from adjacent output regions permits the AND function as in a stroke element. The plurality of input diodes permits performance of the OR function and the remainder of the circuit exclusive of output diodes permits the performance of the NOT function. This modified element is now very flexible since it can be used to perform NOR and stroke operations and also can be used to represent the canonical form of a Boolean function.

Figure 4:
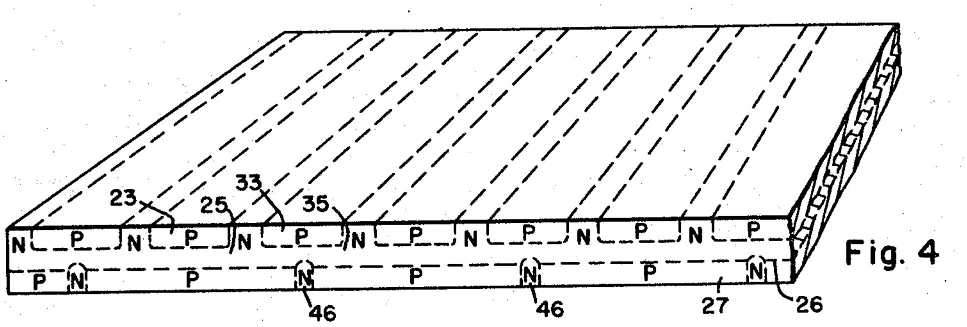
FIG. 4 is a partial perspective view of a semiconductor wafer shown to explain a method of fabricating devices in accordance with the present invention.
Figure 5:
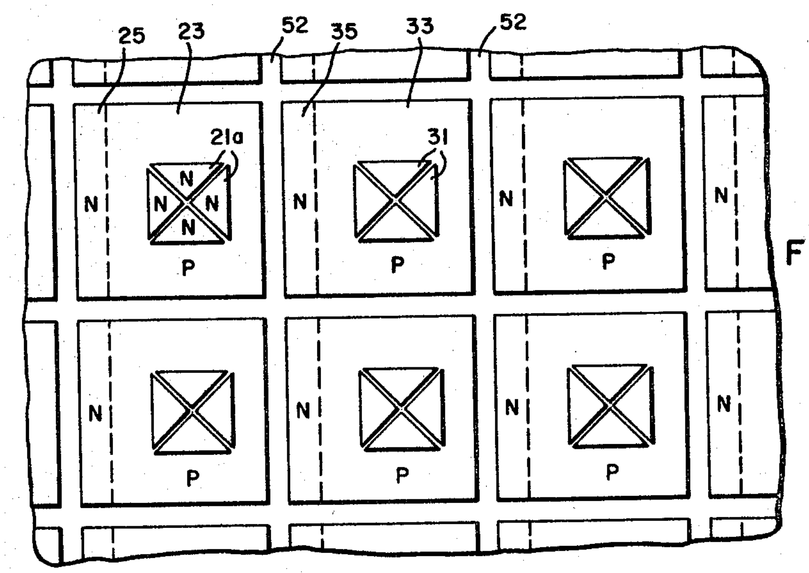
FIG. 5 is a partial plan view at a later stage of fabrication.
Figure 6:
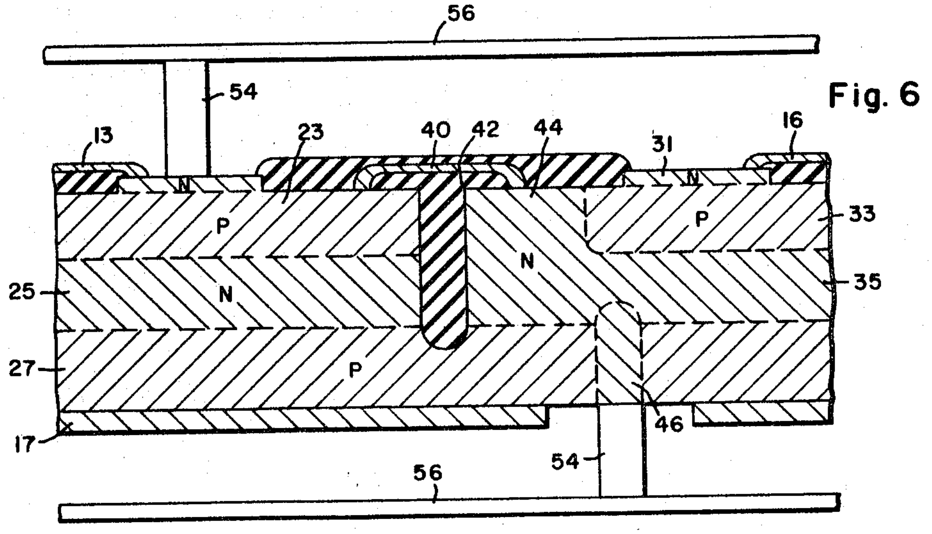
FIG. 6 is a partial cross sectional view of the completed device formed in accordance with the described method.

FIGS. 4, 5 and 6 indicate steps taken in the fabrication of a device in accordance with this invention. The reference numerals correspond to those of FIGS. 1 and 3. The method of fabrication set forth herein is to be regarded as merely by way of example and numerous variations will be suggested to those skilled in the art. FIG. 4 shows the pattern of different impurity doped regions in a wafer of semiconductor material which provides the basic structure of the device. First, a wafer is obtained of a suitable semiconductor material such as p-type silicon. The wafer may conveniently have a thickness of about 10 mils. The wafer may be prepared by any of the methods known to those skilled in the art, for example, a single crystal silicon rod may be pulled from a melt comprised of silicon and at least one element from group III of the periodic table, for example, boron, aluminum or gallium. The wafer is then cut from the rod in any suitable manner such as by using a diamond saw. The cut surface of the wafer may then be lapped or etched or both in order to produce a smooth surface after sawing. In addition, the semiconductor device of this invention may be prepared from a portion of a dendritic crystal prepared in accordance with U.S. patent application, Serial No. 844,288, filed October 5, 1959, now Patent 3,031,403, and assigned to the present assignee.

As a specific example, p-type silicon is used as the starting material. However, the choice of p-type material is not critical and if desired, the semiconductivity of all the regions may be reversed from that described. Also the selection of silicon as the starting wafer is not critical. In addition to silicon, other semiconductor materials such as germanium or a semiconducting compound comprised of an element of group III of the periodic table, such as gallium, aluminum and indium and an element from group V of the periodic table, such as arsenic, phosphorus and antimony, may be used.

By the use of well known masking techniques and diffusion from an appropriately selected atmosphere containing an impurity such as phosphorus, diffusion is carried out until small n-type impurity regions are diffused entirely through the wafer so as to correspond with the desired location of the contacts 46 through the common layer 27 to the third layer 35 of the right-hand structure as in FIG. 1. To obtain a high density array, these regions may be located only about 100 mils apart. Next an n-type surface layer (corresponding to the regions 25 and 35 of FIG. 1) is formed over one surface of the wafer by a similar diffusion operation after removal of masking material from that surface. In a subsequent masking and diffusion operation with a p-type impurity such as boron, there are provided p-type strips on the n-type surface layer which correspond to the second layer of the structure of FIG. 1 (regions 23 and 33).

FIG. 5 shows the completed semiconductor structure after the diodes have been formed, for both the input and output, by evaporation and alloying for example of the portions 21*a* and 31 of the first layer, and deep etched grooves 52 have been formed to separate the wafer into individual segments for each four layer structure.

The final step in creating the array is to make the ohmic connection between the common p-type side 23 of the input diodes to the base layer 35 of the transistor. This can be done by coating all of the surfaces in the etched valleys 52 with an insulating material 42 such as silicon dioxide and then depositing a conductor 40 such as tin from the p-type side 23 of the input diodes to the n-type base layer 35 of the transistor. Because of the selective diffusion used to make the p-type regions 33, the n-type connector 44 is an integral part of the region 35. FIG. 6 shows the resulting structure. Once all the ohmic connections have been made, then all of the surface except for the n-type portions 21*a* and 31 of the input and output diodes can be covered with an insulating material (not shown). This completes the monolith prior to its elements being interconnected to perform specific logic functions. Interconnections for logical operations can be made by depositing a conductor such as tin on the coated surface from output diodes to the input diodes of the various elements. If it is ever necessary that conductors cross each other, insulating material can be used between them. The final step in construction, after the logical interconnections have been made, is to cement resistive rubber buttons 54 to the input diode terminals and to the n-type dots on the underside of the monolith to provide power and bias connection. Ground connection can be made to the common p-type emitter layer 17 or if necessary, this layer may be covered except for the n-type dots 46 with a conducting film. Finally the entire structure is held between two conducting plates 56, the upper plate at B− potential with respect to ground and the other at C+ potential.

While the present invention has been shown and described in certain forms only, it will be obvious to those skilled in the art that is is not so limited but is susceptible of various changes and modifications without departing from the spirit and scope thereof.

I claim as my invention:

1. A monolithic semiconductor device suitable for use as a logic element comprising: a unitary body of semiconductive material having first, second and third regions of alternate type semiconductivity associated to form the emitter, base and collector regions of a junction transistor structure; at least two regions of opposite type semiconductivity associated to form at least one diode structure having one region electrically coupled to the base region of said junction transistor structure and the other diode region having input contact means thereon for receiving an electrical signal; a plurality of separate regions of semiconductivity type opposite to that of said collector region of said junction transistor structure disposed on said collector region, each of said plurality of separate regions having output contact means thereon from which to derive an electrical signal.

2. A monolithic semiconductor device suitable for use as a logic element comprising: a unitary body of semiconductive material having first, second, third and fourth layers of alternate type semiconductivity forming p-n junctions therebetween; said first layer being continuous, said second and third layers each being in two separate portions to form two junction transistor structures having said first continuous layer in common; said fourth layer being in two separate major portions on the separate portions of said third layer, at least one of said major portions being in a plurality of separate minor portions to form a like number of diode structures electrically in series with one of said junction transistor structures.

3. A monolithic semiconductor device suitable for use as a logic element comprising: a unitary body of semiconductive material having first, second, third and fourth layers of alternate type semiconductivity forming p-n junctions therebetween; said first layer being continuous, said second and third layers each being in two separate portions to form two junction transistor structures having said first continuous layer in common; said fourth layer being in two separate major portions on the separate portions of said third layer, at least one of said major portions being in a plurality of separate minor portions to form a like number of diode structures electrically in series with the adjacent one of said junction transistor structures, conductive means to form a conductive path between a first portion of said second layer with a non-contiguous portion of said third layer; input contact means on each of those portions of said fourth layer contiguous to said first portion of said third layer to receive an applied electrical signal; output contact means electrically connected to each of said remaining portions of said fourth layer for deriving an electrical signal therefrom.

4. A stroke logic element comprising a unitary semiconductor device including at least three regions of alternate semiconductivity forming a first junction transistor, a plurality of semiconductive regions disposed on the collector of said first transistor and forming a plurality of p-n junctions therewith and means to obtain an output signal from each of said plurality of portions, a second three layer structure forming a second junction transistor having an emitter in common with said first transistor, at least one input diode disposed in series with the collector of said second transistor, conductive means interconnecting the collector of said second transistor with the base of said first transistor, said second transistor providing isolation between said input diode and said first transistor except for said conductive means.

References Cited in the file of this patent

UNITED STATES PATENTS

| | | |
|---|---|---|
| 2,910,634 | Rutz | Oct. 27, 1959 |
| 2,936,384 | White | May 10, 1960 |